(12) United States Patent
Hsu

(10) Patent No.: US 8,223,324 B2
(45) Date of Patent: Jul. 17, 2012

(54) TESTING DEVICE AND TESTING METHOD EMPLOYING THE SAME

(75) Inventor: Chia-Lung Hsu, Tu-Cheng (TW)

(73) Assignee: Chi Mei Communications Systems, Inc., Tu-Cheng, New Taipei (TW)

( * ) Notice: Subject to any disclaimer, the term of this patent is extended or adjusted under 35 U.S.C. 154(b) by 159 days.

(21) Appl. No.: 12/784,588

(22) Filed: May 21, 2010

(65) Prior Publication Data

US 2011/0241691 A1    Oct. 6, 2011

(30) Foreign Application Priority Data

Mar. 31, 2010  (TW) ................................ 99109803 A

(51) Int. Cl.
*G01R 31/00* (2006.01)
*G01J 1/00* (2006.01)

(52) U.S. Cl. ...................... 356/213; 250/208.1; 324/414

(58) Field of Classification Search .......... 356/213–219; 250/208.1, 226; 324/414, 767, 770, 73.1, 324/764, 765
See application file for complete search history.

(56) References Cited

U.S. PATENT DOCUMENTS

| | | | | |
|---|---|---|---|---|
| 4,449,822 A * | 5/1984 | Yuasa et al. | ................... | 356/227 |
| 5,461,227 A * | 10/1995 | Blau | ............................. | 250/221 |
| 7,056,000 B2 * | 6/2006 | Hussey et al. | ................. | 362/555 |
| 7,064,832 B2 * | 6/2006 | Rogers | .......................... | 356/406 |
| 7,227,639 B2 * | 6/2007 | Schmitt | ........................ | 356/419 |
| 7,301,534 B2 * | 11/2007 | Runolinna | .................... | 345/207 |
| 7,382,148 B2 * | 6/2008 | Dang et al. | ............... | 324/762.07 |
| 7,514,899 B2 * | 4/2009 | Deng-Peng | ................... | 320/101 |
| 7,782,450 B2 * | 8/2010 | Liu et al. | ....................... | 356/213 |
| 2008/0018570 A1 * | 1/2008 | Gerets | ............................. | 345/84 |
| 2009/0220097 A1 * | 9/2009 | Kuo et al. | ...................... | 381/58 |

* cited by examiner

*Primary Examiner* — Sang Nguyen
(74) *Attorney, Agent, or Firm* — Altis Law Group, Inc.

(57) ABSTRACT

An exemplary testing device for testing quality of indicator lights includes a light intensity tester and a control unit electrically connected to the light intensity tester. The light intensity tester includes a testing circuit, and the testing circuit is capable of generating testing parameters of corresponding indicator lights. The control unit is capable of providing electric energy to the indicator lights. The testing parameters from the testing circuit are changed according to light intensity of the indicator lights and are then transmitted to the control unit. Thus, the control unit is capable of comparing the testing parameters with predetermined parameters to detect the quality of the indicator lights.

18 Claims, 3 Drawing Sheets

TESTING DEVICE AND TESTING METHOD EMPLOYING THE SAME

BACKGROUND

1. Technical Field

The disclosure generally relates to testing devices, and more particularly relates, to a testing device and a testing method employing the same use for testing indicator lights of a portable electronic device.

2. Description of the Related Art

Most portable electronic devices, such as mobile phones, personal digital assistants (PDAs), are equipped with different indicator lights, such as a power indicator light and a volume indicator light. Thus, it can be important and necessary to test the qualities of the indicator lights during the assembly process of the portable electronic devices.

However, currently, indicator lights are manually tested one-by-one. The existing method can be inefficient and open to human-error.

Therefore, there is room for improvement within the art.

BRIEF DESCRIPTION OF THE DRAWINGS

Many aspects of an exemplary testing device and testing method employing the same can be better understood with reference to the following drawings. The components in the drawings are not necessarily drawn to scale, the emphasis instead being placed upon clearly illustrating the principles of the exemplary testing device and testing method employing the same. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
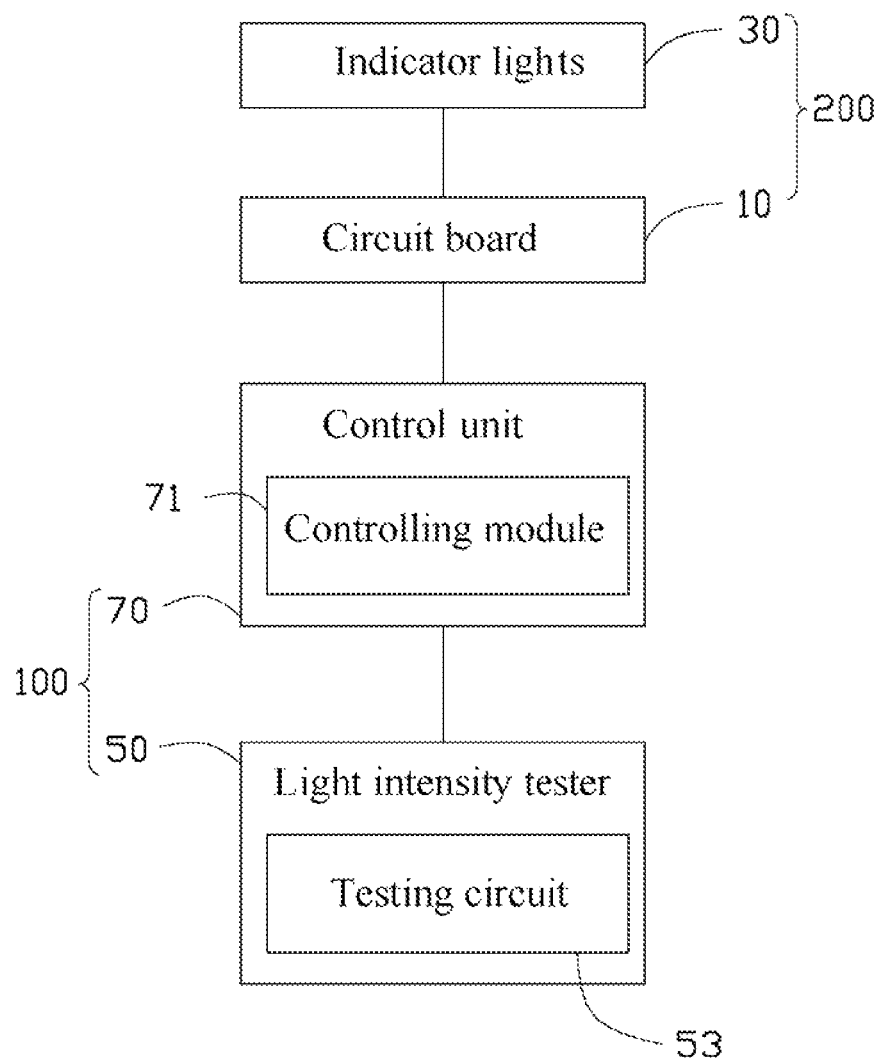
FIG. 1 is a block view of a testing device, according to an exemplary embodiment.

Referring to the drawings, FIG. 1 shows an exemplary embodiment of a testing device 100 applied in a portable electronic device 200, such as a mobile phone, to test the qualities of indicator lights of the portable electronic device 200. The portable electronic device 200 includes a circuit board 10 and a plurality of indicator lights 30 electrically connected to the circuit board 10. The testing device 100 includes a light intensity tester 50 and a control unit 70 electrically connected to the circuit board 10 and the light intensity tester 50.

Figure 3:
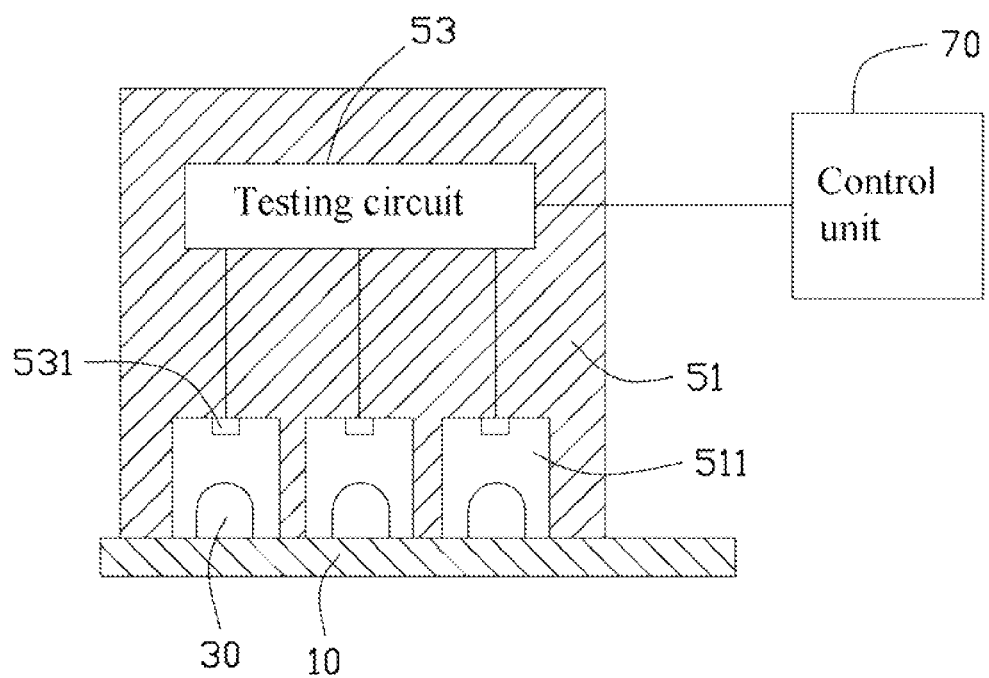
FIG. 3 is a cross-sectional view of the testing device shown in FIG. 1, illustrating to detect indicator lights.

Referring to FIG. 3, the circuit board 10 can be a printed circuit board (PCB) and is capable of establishing electrical connection of various electronic components of the portable electronic device 200. The indicator lights 30 are electrically connected and mounted at positions of the portable electronic device 200 corresponding to, for example, the screen or keypad. The indicator lights 30 can be electrically connected to a control device, such as a central processing unit (CPU), through the circuit board 10 to power the indicator lights 30 on/off under the control of the control device. In this exemplary embodiment, the indicator lights 30 can be light emitting diodes (LEDs).

Figure 2:
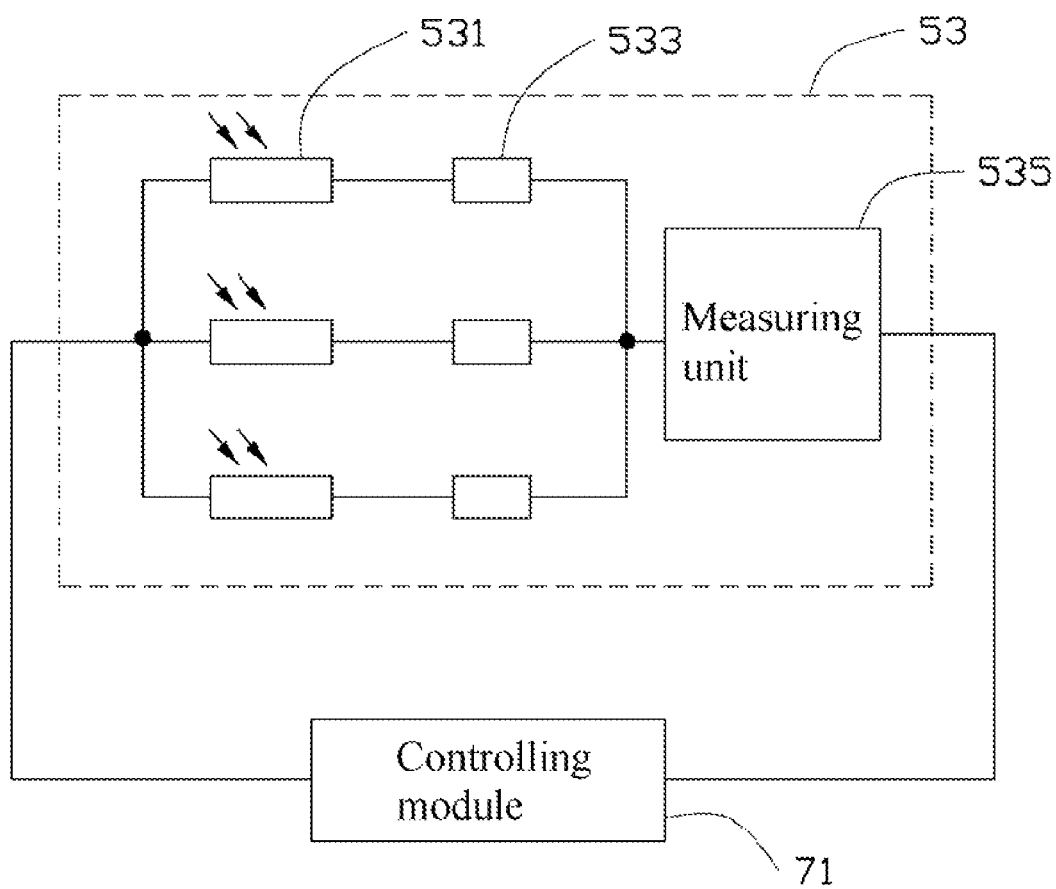
FIG. 2 is a block view of a testing circuit and a controlling module of the testing device shown in FIG. 1.

Referring to FIGS. 2 and 3, the light intensity tester 50 includes a hood 51 and a testing circuit 53 attached to or imbedded in the inside of the hood 51. During testing, the hood 51 is positioned on the circuit board 10, and the testing circuit 53 is electrically connected to the control unit 70.

The hood 51 has a substantial honeycomb structure and defines a plurality of receiving spaces 511. Each receiving space 511 corresponds in position to one of the indicator lights 30. The receiving spaces 511 are capable of receiving the corresponding indicator lights 30. The receiving spaces 511 are spaced from each other. When the light intensity tester 50 is installed on the circuit board 10, the receiving spaces 511 are sealed by the circuit board 10. Thereby, the indicator lights 30 received in each of the corresponding receiving spaces 511 are isolated from each other to prevent mixing of their light, so the light from each indicator light 30 is not mixed or affected by the light of another indicator light 30. Thus, each indicator light 30 can be detected independently.

Further referring to FIG. 3, the testing circuit 53 includes a plurality of photosensitive units 531, and a plurality of resistors 533, and a measuring unit 535. The photosensitive units 531 can be photo resistors. Accordingly, the photosensitive units 531 are capable of sensing the light intensity of the indicator lights 30. The photosensitive units 531 correspond to the indicator lights 30 and are positioned in the corresponding receiving spaces 511.

Each resistor 533 can have a constant resistance or be a rheostat and is electrically connected in series to a corresponding photosensitive unit 531 and all the groups of resistors 533/photosensitive units 531 are connected together in parallel. In this exemplary embodiment, there are three resistors 533 and three photosensitive units 531, the photosensitive units 531 and resistors 533 are electrically connected in series to form three series connections, and the three series connections are connected in parallel. The resistors 533 are electrically connected to the measuring unit 535. The measuring unit 535 is electrically connected to the parallel connection and the control unit 70, and is capable of measuring the voltage values of the resistors 533, and transmits the measured voltage values to the control unit 70.

The control unit 70 can provide electric energy to the circuit board 10 and the light intensity tester 50 through a connector, such as a universal serial bus (USB) connector. The control unit 70 includes a controlling module 71. The controlling module 71 can control the control unit 70 to provide electric energy to the circuit board 10, and then control the indicator lights 30 to power on/off. The controlling module 71 is electrically connected to the measuring unit 535 and is capable of storing voltage values of the resistors 533 from the measuring unit 535, and is also capable of storing a predetermined voltage range of the corresponding resistors 533 indicative of when the corresponding indicator lights 30 are in normal working state or light intensity range.

When each indicator light 30 is respectively powered on under the control of the controlling module 71, the measuring unit 535 measures the voltage values of the resistors 533 corresponding to the indicator lights 30. Then the controlling module 71 receives the measured voltage values from the measuring unit 535, and compares the measured voltage values with the predetermined voltage ranges to determine whether the light intensity of the indicator lights 30 meets the normal test requirement or not.

In use, the circuit board 10 is electrically connected to the control unit 70, and the control unit 70 provides electric energy to the circuit board 10 and the indicator lights 30. The indicator lights 30 are aligned with and received within the corresponding receiving spaces 511, so that the indicator lights 30 are isolated from each other. The light intensity tester 50 is electrically connected to the control unit 70, any or all the indicator lights 30 to be tested are powered on, and resistance values of the photosensitive units 531 may change when exposed to light of the corresponding indicator light 30. Reading the resistances of the photosensitive units 531 can accurately determine the light intensity of the corresponding indicator lights 30 without other light interference and without the need for an operator to use their own judgment.

The measuring unit 535 measures the voltage values of the resistors 533 and transmits the measured voltage values to the controlling module 71. The controlling module 71 stores the measured voltage values from the measuring unit 535, and compares the measured voltage values with the predetermined voltage range to determine whether the measured voltage values are within the predetermined voltage range. If the measured voltage values are within the predetermined voltage range, the light intensity of the indicator lights 30 meets the test requirement. If the measured voltage values are out of the predetermined voltage range, the luminance of the indicator lights 30 fail to meets the test requirement.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in matters of shape, size, and arrangement of parts within the principles of exemplary disclosure to the full extent indicated by the broad general meaning of the terms in which the appended claims are expressed.

What is claimed is:

1. A testing device for testing quality of indicator lights, comprising:
    a light intensity tester comprising a testing circuit, the testing circuit capable of generating testing parameters of the corresponding indicator lights, the testing circuit comprising:
        a plurality of photosensitive units corresponding to the indicator lights, and the resistance value of each photosensitive capable of being changed according to the light intensity of the corresponding indicator light; and
        a plurality of resistors, the voltage value of each resistor capable of being changed according to the resistance value of the corresponding photosensitive unit; and
    a control unit electrically connected to the light intensity tester, wherein the control unit is capable of providing electric energy to light any or all the indicator lights, the testing parameters from the testing circuit are changed according to light intensity of the indicator lights and are then transmitted to the control unit, and the control unit is capable of comparing the testing parameters with predetermined parameters to detect the quality of the indicator lights.

2. The testing device as claimed in claim 1, wherein the control unit comprises a controlling module electrically connected to the plurality of photosensitive units of the testing circuit, the controlling module receives the testing parameters from the testing circuit and compares the testing parameters with the predetermined parameters to determine whether the light intensity of the indicator lights meets the test requirement or not.

3. The testing device as claimed in claim 2, wherein if the testing parameters are within the predetermined parameters, the indicator lights meet the test requirement, and if the testing parameters are without the predetermined parameters, the indicator lights fail to meet the test requirement.

4. The testing device as claimed in claim 2, wherein the testing circuit further comprises a measuring unit electrically connected to the resistors and the controlling module, and the measuring unit is capable of measuring the voltage values of the resistors and transmitting the voltage values to the control unit.

5. The testing device as claimed in claim 1, wherein each resistor is electrically connected in series to a corresponding photosensitive unit and all the groups of resistors and photosensitive units are connected together in parallel.

6. The testing device as claimed in claim 1, wherein the light intensity tester further comprises a hood, the testing circuit is within the hood, and the hood is detachably positioned on a circuit board.

7. The testing device as claimed in claim 6, wherein the indicator lights are electrically connected and positioned on the circuit board, the hood defines a plurality of receiving spaces, each receiving space corresponding to one of the indicator lights, the receiving spaces are spaced from each other, and each indicator light is received in a corresponding receiving space.

8. The testing device as claimed in claim 7, wherein when the light intensity tester is installed on the circuit board, the receiving spaces are sealed by the circuit board, and the indicator lights received in the corresponding receiving spaces are isolated from each other to avoid interference and be independently tested.

9. A testing device for testing indicator lights of a portable electronic device, comprising:
    a light intensity tester comprising a testing circuit, the testing circuit capable of generating voltage parameters of the corresponding indicator lights, the testing circuit comprising:
        a plurality of photosensitive units; and
        a plurality of resistors corresponding in number to the indicator lights, each resistor electrically connected in series to a corresponding photosensitive unit to form a plurality of series connections, and groups of resistors and photosensitive units electrically connected to form a parallel connection circuit; and
    a control unit electrically connected to the light intensity tester, wherein the control unit is capable of providing electric energy to the indicator lights and powering the indicator lights on/off, the voltage parameters from the testing circuit are changed according to light intensity of the indicator lights when the indicator lights are lit and then are transmitted to the control unit, and the control unit is capable of comparing the testing parameters with predetermined voltage parameters to determine whether the indicator lights are acceptable or not.

10. The testing device as claimed in claim 9, wherein the control unit further comprises a controlling module electrically connected to the plurality of photosensitive units of the testing circuit, the controlling module controls the indicator lights to power on and receives the voltage parameters from the testing circuit and compares the voltage parameters with the predetermined voltage parameters to determine whether the light intensity of the indicator lights meets the test requirement or not.

11. The testing device as claimed in claim 10, wherein if the voltage parameters are within the predetermined voltage parameters, the indicator lights meet the test requirement, and if the voltage parameters are without the predetermined voltage parameters, the indicator lights fail to meet the test requirement.

12. The testing device as claimed in claim 10, wherein the resistance value of each photosensitive unit is changed according to the light intensity of the corresponding indicator light, and the voltage value of each resistor is changed according to the resistance value of the corresponding photosensitive unit.

13. The testing device as claimed in claim 12, wherein the testing circuit further comprises a measuring unit electrically connected to the resistors and the controlling module, and the measuring unit is capable of measuring the voltage values of the resistors and transmitting the voltage values to the control unit.

14. The testing device as claimed in claim 9, wherein the light intensity tester further comprises a hood, the testing circuit is within the hood, and the hood is detachably positioned on a circuit board.

15. The testing device as claimed in claim 14, wherein the indicator lights are electrically connected and positioned on the circuit board, the hood defines a plurality of receiving spaces corresponding to the indicator lights, the receiving spaces are spaced from each other, and the indicator lights are received in the corresponding receiving spaces.

16. The testing device as claimed in claim 15, wherein when the light intensity tester is installed on the circuit board, the receiving spaces are sealed by the circuit board, and the indicator lights received in the corresponding receiving spaces are isolated with each other to avoid interference and be independently tested.

17. A testing method of testing an indicator light using a testing device, the testing method comprising:
provided the testing device having a plurality of photosensitive units corresponding to the indicator lights, and the resistance value of each photosensitive capable of being changed according to the light intensity of the corresponding indicator light, and a plurality of resistors, the voltage value of each resistor capable of being changed according to the resistance value of the corresponding photosensitive unit;
placing the indicator light in a receiving space including a photo resistor;
powering on the indicator light by a control unit of the testing device;
measuring the voltage of the photo resistor by a controlling module of the control unit; and
comparing the voltage of the photo resistor with a predetermined voltage indicative of an acceptable light by the controlling module.

18. The testing method as claimed in claim 17, wherein if the voltage of the photoresistor is within the predetermined voltage, the indicator light meets the test requirement; and if the voltage of the photoresistor is without the predetermined voltage, the indicator light fails to meet the test requirement.

* * * * *

UNITED STATES PATENT AND TRADEMARK OFFICE
CERTIFICATE OF CORRECTION

PATENT NO. : 8,223,324 B2
APPLICATION NO. : 12/784588
DATED : July 17, 2012
INVENTOR(S) : Hsu It is certified that error appears in the above-identified patent and that said Letters Patent is hereby corrected as shown below:

On the title page, item [73] should read:

[73] Assignee: Chi Mei Communication Systems, Inc., Tu-Cheng, New Taipei (TW)

Signed and Sealed this
Twenty-ninth Day of October, 2013

Teresa Stanek Rea
*Deputy Director of the United States Patent and Trademark Office*